United States Patent
Borthakur et al.

(10) Patent No.: US 10,510,787 B2
(45) Date of Patent: Dec. 17, 2019

(54) STRUCTURES AND METHODS OF CREATING CLEAR PIXELS

(71) Applicant: SEMICONDUCTOR COMPONENTS INDUSTRIES, LLC, Phoenix, AZ (US)

(72) Inventors: Swarnal Borthakur, Boise, ID (US); Nathan Wayne Chapman, Meridian, ID (US); Brian Anthony Vaartstra, Nampa, ID (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/787,959

(22) Filed: Oct. 19, 2017

(65) Prior Publication Data

US 2019/0123083 A1   Apr. 25, 2019

(51) Int. Cl.
  *H01L 27/146* (2006.01)
(52) U.S. Cl.
  CPC .... *H01L 27/14621* (2013.01); *H01L 27/1462* (2013.01); *H01L 27/14627* (2013.01); *H01L 27/14645* (2013.01); *H01L 27/14685* (2013.01)
(58) Field of Classification Search
  CPC ......... H01L 27/14621; H01L 27/14645; H01L 27/14685; H01L 27/14627; H01L 27/146; H01L 23/3107; H01L 23/3121; H01L 23/315; H01L 23/3142; H01L 23/3192; H01L 27/124; H01L 27/14623; H01L 27/3244; H01L 27/3248; H01L 27/3253; H01L 27/3262; H01L 27/3267; H01L 27/3272; H01L 27/3276; H01L 27/3286; H01L 27/1462; H01L 27/14603; H01L 27/14605; H01L 27/14614; H01L 27/14625; G02F 1/0107; G02F 1/133; G02F 1/1333; G02F 1/133345; G02F 1/133354; G02F 1/13336; G02F 1/133512;

(Continued)

(56) References Cited

U.S. PATENT DOCUMENTS 5,889,277 A * 3/1999 Hawkins ........... H01L 27/14868
                                          250/208.1
7,955,764 B2   6/2011 Liu et al.

(Continued)

*Primary Examiner* — Natalia A Gondarenko
(74) *Attorney, Agent, or Firm* — Treyz Law Group, P.C.; Tianyi He

(57) ABSTRACT

An image sensor may include an array of pixels having a color filter layer. The color filter layer may include colored elements and clear elements. The clear elements may be formed from transparent dielectric material. The color filter layer may include a grid of light-blocking material that forms color filter container structures having an array of openings in which the colored elements and the clear elements are formed. The color filter container structures may be formed from the same transparent dielectric material that forms the clear elements. The color filter container structures may be formed from opaque materials or transparent materials that form structures such as planarization layers, microlenses, or antireflection coatings for the array of pixels. The material used to form the color filter container structures may have a refractive index that is sufficiently high to prevent light from passing between adjacent elements in the color filter layer.

13 Claims, 15 Drawing Sheets

(58) Field of Classification Search
CPC ......... G02F 1/133514; G02F 1/133519; G02F 1/133608; G02F 1/1339; G02F 1/136209; G02F 1/1368; G02F 1/136286
USPC .......... 257/72, 432, E31.127; 349/40, 42, 43
See application file for complete search history.

(56) References Cited

U.S. PATENT DOCUMENTS

| | | | |
|---|---|---|---|
| 9,013,612 B2* | 4/2015 | Del Monte | H01L 27/14629 348/272 |
| 2009/0224347 A1* | 9/2009 | Kim | H01L 27/14625 257/432 |
| 2012/0019695 A1 | 1/2012 | Qian et al. | |
| 2012/0086093 A1* | 4/2012 | Otsuka | H01L 27/14621 257/432 |
| 2014/0098332 A1* | 4/2014 | Kim | G02F 1/133512 349/106 |
| 2014/0210028 A1 | 7/2014 | Chen et al. | |
| 2014/0210032 A1* | 7/2014 | Maeda | H01L 27/14621 257/432 |
| 2015/0048467 A1 | 2/2015 | Weng et al. | |
| 2016/0054173 A1* | 2/2016 | Kim | H01L 27/14685 250/208.1 |
| 2016/0148970 A1* | 5/2016 | Cheng | H01L 27/14645 257/292 |
| 2016/0276396 A1* | 9/2016 | Tayanaka | H01L 27/14623 |
| 2017/0077160 A1* | 3/2017 | Hashimoto | H01L 27/14806 |
| 2017/0170220 A1* | 6/2017 | Nam | H01L 27/14605 |
| 2017/0301718 A1* | 10/2017 | Chou | G03B 13/36 |
| 2018/0076247 A1* | 3/2018 | Pang | H01L 27/14623 |

* cited by examiner

STRUCTURES AND METHODS OF CREATING CLEAR PIXELS

BACKGROUND

This application relates to image sensors, and more particularly, image sensors having color filter layers.

Image sensors are commonly used in electronic devices such as cellular telephones, cameras, and computers to capture images. In a typical arrangement, an electronic device is provided with an array of image pixels arranged in pixel rows and pixel columns. The image pixels contain a photodiode for generating charge in response to light. Circuitry is commonly coupled to each pixel column for reading out image signals from the image pixels.

Image sensors may include a color filter layer having colored elements and clear elements formed above the photodiodes in the array. Colored photoresist may be deposited and patterned to form the colored elements. Clear photoresist may be deposited and patterned to form the clear elements. Light-blocking structures may be provided between these elements to prevent light that is passing through an element for one pixel from entering an element for an adjacent pixel and causing cross-talk. Separate fabrication steps that may be required for forming the colored elements, the clear elements, and the light-blocking structures may cause the manufacturing process to be complicated and costly. Clear photoresist materials may be susceptible to defects and may not provide an ideal transmission profile.

It would therefore be desirable to provide image sensors with color filter layers having improved clear elements.

DETAILED DESCRIPTION

Electronic devices such as digital cameras, computers, cellular telephones, and other electronic devices may include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements.

Figure 1:
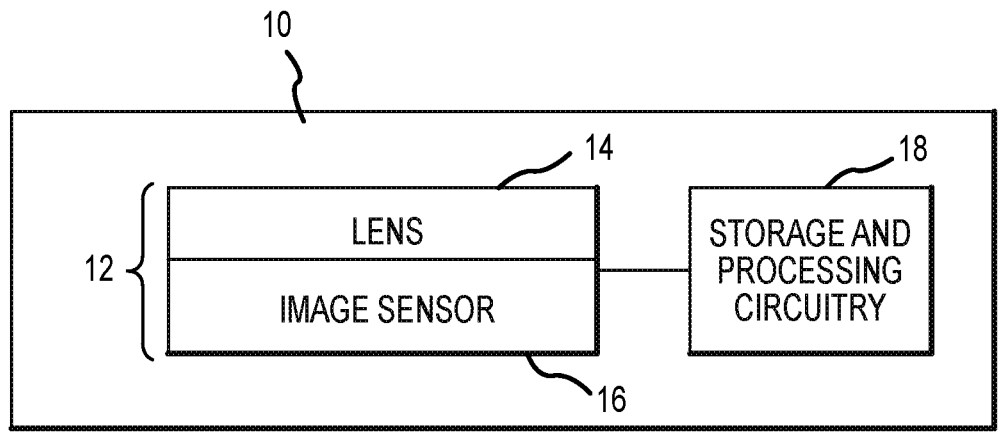
FIG. 1 is a diagram of an illustrative electronic device having an image sensor and processing circuitry for capturing images using a pixel array with clear pixels.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
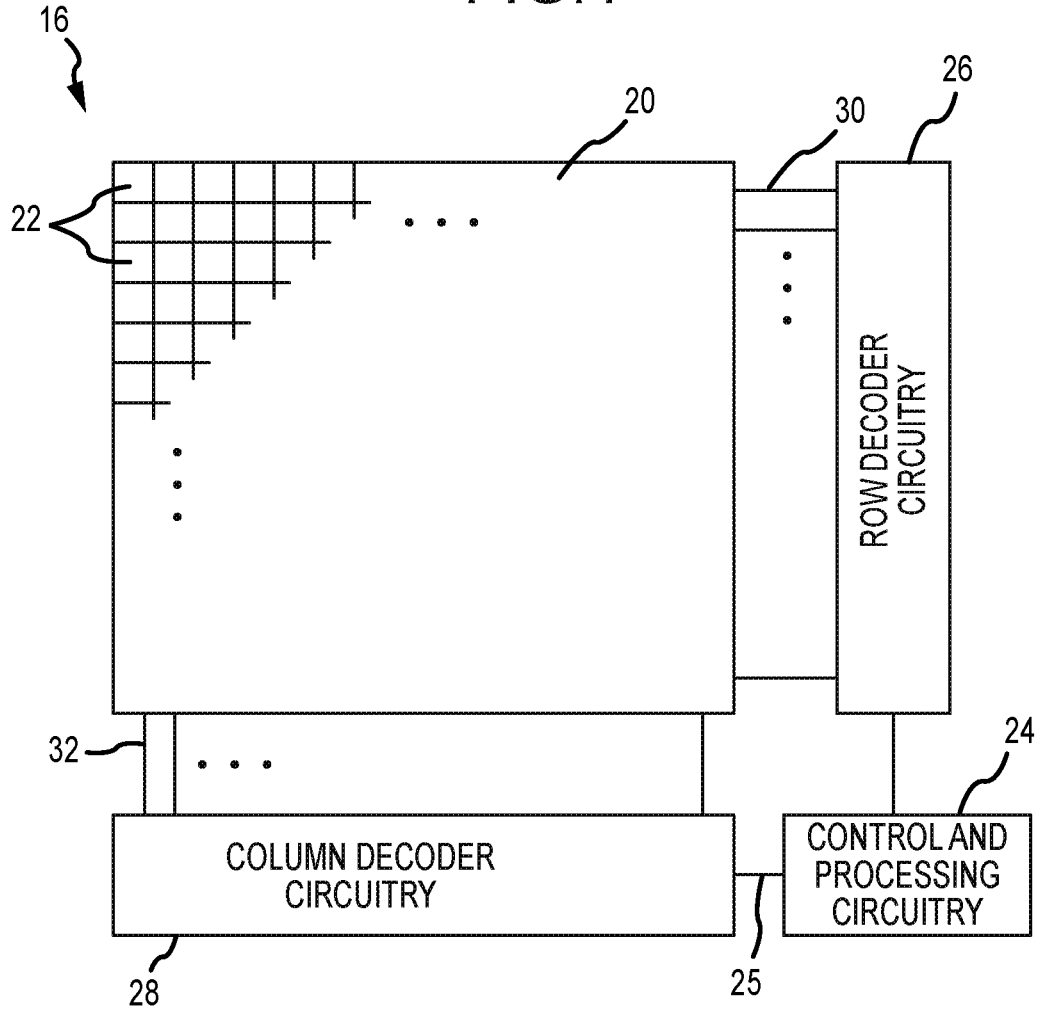
FIG. 2 is a diagram of an illustrative pixel array and associated readout circuitry for reading out image signals from the pixel array in accordance with an embodiment of the present invention.

As shown in FIG. 2, image sensor 16 may include a pixel array 20 containing image sensor pixels 22 arranged in rows and columns (sometimes referred to herein as image pixels or pixels) and control and processing circuitry 24 (which may include, for example, image signal processing circuitry). Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, a color filter array may be formed over photosensitive regions in array 20 so that a desired color filter element in the color filter array is formed over an upper surface of the photosensitive region of an associated pixel 22. A microlens may be formed over an upper surface of the color filter array to focus incoming light onto the photosensitive region associated with that pixel 22. Incoming light may be focused onto the photosensitive region by the microlens and may pass through the color filter element so that only light of a corresponding color is captured at the photosensitive region. If desired, an antireflection coating may be formed on the microlens.

If desired, pixels 22 in array 20 of FIG. 2 may be provided with an array of color filter elements that each pass one or more colors of light. All or some of pixels 22 may be provided with a color filter element. Color filter elements for pixels 22 may be red color filter elements (e.g., photoresist material that passes red light while reflecting and/or absorbing other colors of light), blue color filter elements (e.g., photoresist material that passes blue light while reflecting and/or absorbing other colors of light), and/or green color filter elements (e.g., photoresist material that passes green light while reflecting and/or absorbing other colors of light). If desired, some pixels 22 in array 20 may be provided with transparent material that passes light throughout the visible spectrum (e.g., red, green, and blue light). This transparent material may take the place of the color filter elements in these pixels, but may not filter light based on wavelength as the other color filter elements do. Due to their location in the array with the other color filter elements, however, this transparent material may be referred to as a clear color filter element, a transparent color filter element, or a clear element. Pixels that include this transparent material in place of a red, green, blue, or other wavelength-selective color filter may be referred to as clear pixels.

Color filter elements may also be configured to filter light that is outside the visible human spectrum. For example, color filter elements may be configured to filter ultraviolet or infrared light (e.g., a color filter element may only allow infrared light or ultraviolet light to reach the photodiode). Color filter elements may configure image pixel 22 to only detect light of a certain wavelength or range of wavelengths (sometimes referred to herein as a wavelength band) and may be configured to allow multiple wavelengths of light to pass while blocking light of certain other wavelengths (for example, light having a wavelength that corresponds to a certain visible color and/or an infrared or ultraviolet wavelength).

Color filter elements that pass two or more colors of light (e.g., two or more colors of light selected from the group that includes red light, blue light, and green light) are sometimes referred to herein as "broadband" filter elements. For example, yellow color filter elements that are configured to pass red and green light may be referred to herein as broadband filter elements or broadband color filter elements. Magenta color filter elements that are configured to pass red and blue light may be also be referred to herein as broadband filter elements or broadband color filter elements. Clear color filter elements that are configured to pass red, green, blue, and other wavelengths of visible or non-visible light may also be referred to herein as broadband filter elements or broadband color filter elements. Similarly, image pixels that include a broadband color filter element (e.g., a yellow, magenta, or clear color filter element) and that are therefore sensitive to two or more colors of light (e.g., that capture image signals in response to detecting two or more colors of light selected from the group that includes red light, blue light, and green light) may sometimes be referred to herein as broadband pixels or broadband image pixels. Image signals generated by broadband image pixels may sometimes be referred to herein as broadband image signals. Broadband image pixels may have a natural sensitivity defined by the material that forms the broadband color filter element and/or the material that forms the image sensor pixel (e.g., silicon). In another suitable arrangement, broadband image pixels may be formed without any color filter elements. The sensitivity of broadband image pixels may, if desired, be adjusted for better color reproduction and/or noise characteristics through use of light absorbers such as pigments. In contrast, "colored" pixel may be used herein to refer to image pixels that are primarily sensitive to one color of light (e.g., red light, blue light, green light, or light of any other suitable color). Colored pixels may sometimes be referred to herein as narrowband image pixels because the colored pixels have a narrower spectral response than the broadband image pixels.

If desired, narrowband pixels and/or broadband pixels that are not configured to be sensitive to infrared light may be provided with color filters incorporating absorbers of NIR radiation. Color filters that block near-infrared light may minimize the impact of infrared light on color reproduction in illuminants containing both visible and infrared radiation.

As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. However, limitations of signal to noise ratio (SNR) that are associated with the Bayer Mosaic pattern make it difficult to reduce the size of image sensors such as image sensor 16. In another suitable example, the green pixels in a Bayer pattern are replaced by broadband image pixels having broadband color filter elements (e.g., clear color filter elements). These examples are merely illustrative and, in general, color filter elements of any desired color and in any desired pattern may be formed over any desired number of image pixels 22.

If desired, a color filter layer may include color filter housing structures (sometimes referred to herein as color filter container structures, light-blocking structures, an in-pixel grid, or light containment structures) in which the color filter elements are formed. Color filter housing structures may include a grid of material that forms an array of openings in which color filter elements are deposited (e.g., the color filter elements fill the holes). An array of color filter elements that are contained within such housing structures are sometimes referred to as a color filter array-in-a-box (sometimes abbreviated as "CFA-in-a-box" or "CIAB"). Color filter housing structures may have light-blocking or light-reflecting properties that prevent light that is incident upon one pixel from reaching an adjacent pixel as the light passes through a color filter element. In this way, color filter housing structures may offer improved light guiding capabilities for directing light to desired image sensor pixels.

Figure 3:
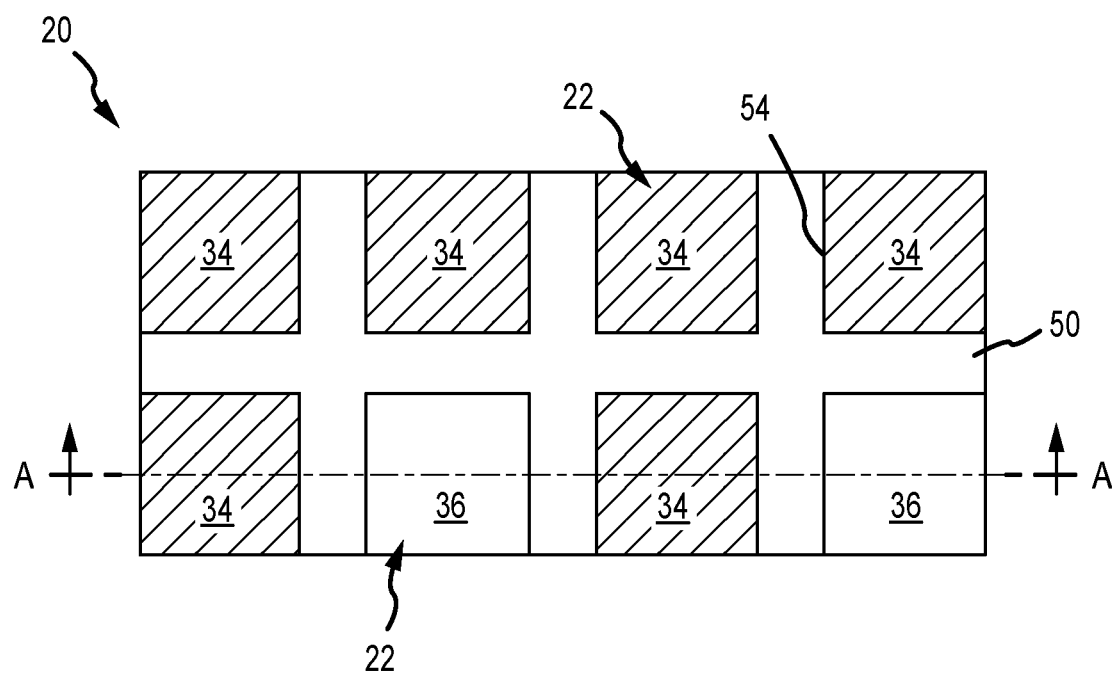
FIG. 3 is a top view of a portion of an illustrative pixel array having a color filter layer with colored elements, clear elements, and color filter container structures.

FIG. 3 is a top view of an illustrative portion of an array 20 of image pixels 22 having a CIAB arrangement of the type described above. As shown in FIG. 3, a grid of color filter container material 50 forms an array of openings 54. The color filter elements of individual pixels 22 are formed in the openings 54. In the illustrative example of FIG. 3, array 20 includes some pixels 22 having color filter elements 34 (e.g., red, green, and/or blue color filter elements) and some pixels 22 having clear elements 36. The arrangement of color filter elements 34 and clear elements 36 in FIG. 3 is merely illustrative. In general, color filter elements 34 and clear elements 36 may be arranged in any suitable pattern. Color filter elements 34 of different colors may also be arranged in a variety of suitable patterns (e.g., a Bayer mosaic pattern, a modified Bayer mosaic pattern in which green color filters are replaced with clear filter elements, etc.).

In the illustrative example of FIG. 3, color filter elements 34 may be formed of red, green, blue, cyan, yellow, magenta, or other colored photoresists that are patterned using photolithography techniques. In general, organic materials having refractive indices of between 1.6 and 1.8 may be used for forming red, green, blue, cyan, yellow, magenta, or other colors of color filter elements. Clear elements 36, on the other hand, may be formed of a transparent dielectric material such as silicon dioxide ($SiO_2$), silicon nitride ($Si_3N_4$), or silicon oxynitride (SiON), as examples. In general, clear dielectric elements 36 may be formed of dielectric materials having indices of refraction that are higher than those of the photoresist materials used to form colored elements 34 (e.g., clear dielectric elements 36 may be formed from dielectric materials having an index of refraction between 1.8 and 2.2).

Figure 4:
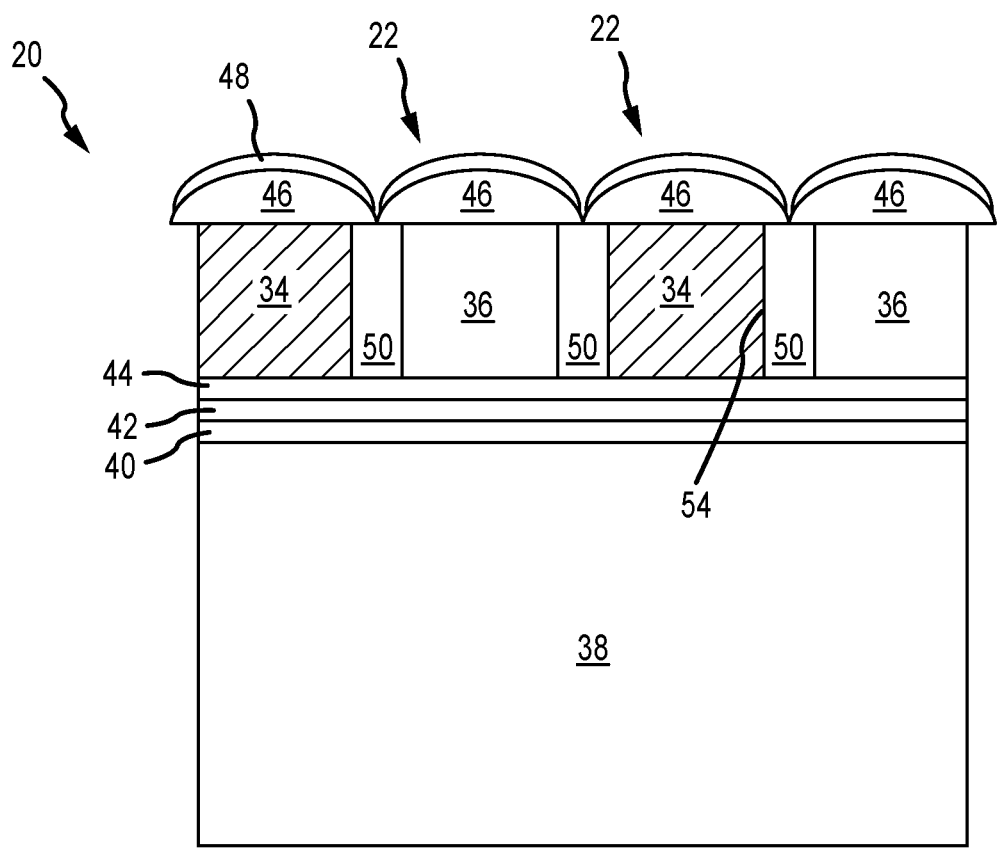
FIG. 4 is a cross-sectional side view of a portion of an illustrative pixel array of the type shown in FIG. 3.

FIG. 4 is an illustrative cross-sectional side view of the portion of array 20 in FIG. 3 taken along line A-A. As shown in FIG. 4, pixel array 20 may include a layer of silicon 38 (e.g., a layer of epitaxial silicon) in which photodiodes for the pixels 22 are formed. Dielectric layers such as dielectric layer 40 (e.g., a high-k dielectric such as hafnium oxide or tantalum pentoxide), dielectric layer 42 (e.g., an oxide layer), and dielectric layer 44 (e.g., a nitride layer) may be formed over silicon layer 38. Color filter container structures 50 are formed on the dielectric layers and form openings 54 in which color elements 34 and clear elements 36 are formed. Each pixel 22 may be provided with a microlens 46. Microlenses 46 may be formed of a transparent organic material having a refractive index of approximately 1.4-1.6. In the illustrative example of FIG. 4, microlenses 46 are formed directly on color filter elements 34 and clear elements 36 without any intervening layers. An antireflective coating 48 may be provided over the microlenses 46. Antireflective coating 48 may be formed of a transparent dielectric material (e.g., silicon dioxide having a refractive index of about 1.4-1.5).

In the illustrative example of FIG. 4, container structures 50 may be formed of opaque material. For example, container material 50 may be an opaque organic material, an opaque metal material, an opaque metalorganic material, or a combination (composite) of metal material and dielectric material such as oxide (sometimes referred to herein as a composite grid). If desired, container material 50 of FIG. 4 may be black, white, red, green, blue, or some other opaque color. Opaque container material of the type described in connection with FIG. 4 may be formed using spin-on techniques, chemical vapor deposition, physical vapor deposition, or other deposition processes. Chemical-mechanical planarization (CMP) techniques may be used to planarize the upper surfaces of colored elements 34, clear elements 36, and container structures 50 (i.e., to make the upper surfaces of these structures flush with each other). Forming color filter container structures 50 of opaque material may prevent light that enters one pixel (e.g., light that enters the pixel at an angle) from exiting through the peripheral edge of the color filter element (or clear element) and passing into another adjacent pixel. In this way, container structures 50 may help to reduce cross-talk between pixels 22 in array 20.

Figure 5:
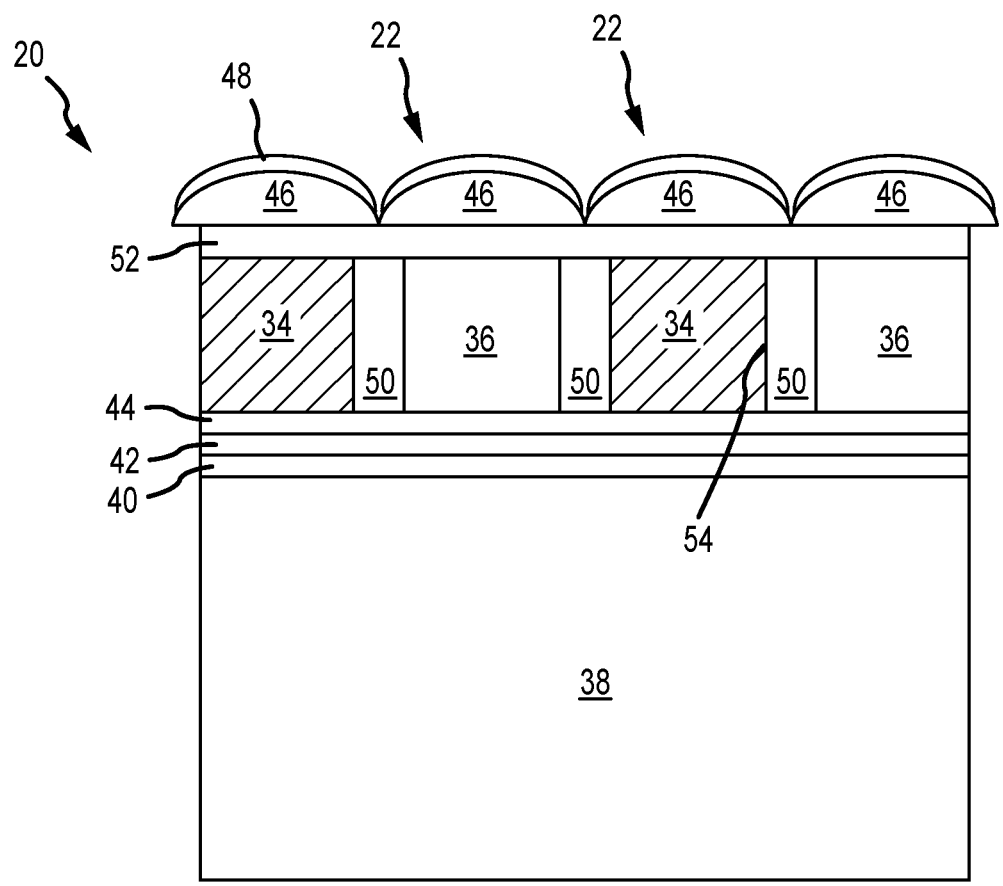
FIG. 5 is a cross-sectional side view of a portion of an illustrative pixel array of the type shown in FIG. 3 having a planarization layer.

In the illustrative example of FIG. 4, microlenses 46 are formed directly on the upper surfaces of color filter elements 34, clear elements 36, and container structures 50. This, however, is merely illustrative. As shown in FIG. 5, a planarization layer 52 may be formed between the color filter layer in which elements 34 and 36 are formed, and the microlens layer in which microlenses 46 are formed. Planarization layer 52 may help planarize the surface of color filter elements 34, clear elements 36, and container structures 50, thereby providing a planar surface on which microlenses 46 may be formed. Planarization layer 52 may be formed of transparent organic material having a refractive index of approximately 1.4-1.6. Because of the chemical-mechanical planarization processes that may be used in forming pixel array 20, however, color filter elements 34, clear elements 36, and container structures 50 may form a planar surface on which microlenses 46 may be formed without the presence of planarization layer 52. In this way, planarization layer 52 may be optional.

Figure 6:
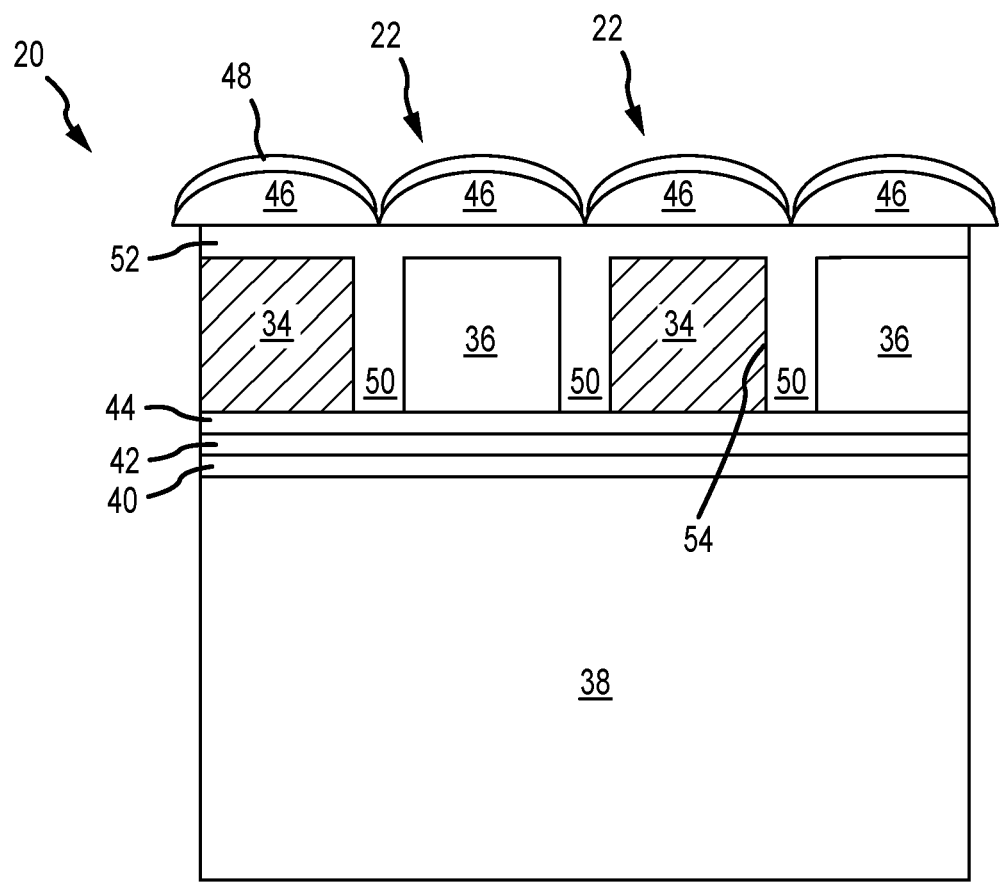
FIG. 6 is a cross-sectional side view of a portion of an illustrative pixel array of the type shown in FIG. 3 having a planarization layer that forms the color filter container structures.

In a pixel array 20 that does include planarization layer 52, the planarization layer 52 itself may be used to form container structures 50. An illustrative example of such an arrangement is shown in FIG. 6. In this arrangement, the gaps between elements 34 and 36 are filled with planarization layer 52. Although planarization layer 52 is formed of transparent material (e.g., transparent organic material) to allow light to pass to the photodiodes in silicon layer 38, there may be a relatively large index of refraction difference between the material of planarization layer 52 and the elements in the color filter layer. Accordingly, there may be a relatively large index of refraction difference between color filter container structures 50 formed from planarization layer 52 and colored elements 34. Because clear elements 36 are formed of transparent materials having high indices of refraction, there may also be a high index of refraction difference between color filter container structures 50 formed from planarization layer 52 and clear elements 36, despite the fact that both of these structures are transparent. These large index of refraction differences may prevent light from passing from the clear element 36 or colored element 34 of one pixel into the filter element of an adjacent pixel, thereby reducing cross-talk between pixels 22. By using planarization layer 52 as the color filter container material 50, the need for an additional layer of material for the color filter container structures (and the manufacturing steps associated with such a layer) may be avoided.

In the example described above in connection with FIG. 6, layer 52 is a planarization layer formed of, for example, transparent organic material. This, however, is merely illustrative. If desired, layer 52 may be formed from a conductive, transparent dielectric material such as indium tin oxide (ITO). In arrangements in which layer 52 extends between filter elements 34 and 36 to form container structures 50, the container structures 50 may be made to be conductive. If desired, clear elements 36 may also be formed from indium tin oxide, both in arrangements in which container structures 50 are formed from indium tin oxide, and in arrangements in which container structures 50 are formed from other materials (or omitted entirely). By forming container structures 50 and/or clear elements 36 from indium tin oxide, it may be possible to ground the container structures 50 through a ground bond pad. By grounding container structures 50, electrical charge that accumulates during fabrication of image sensor 16 may be discharged. This may reduce dark current (e.g., plasma-induced dark current) generated by pixels 22 as a result of image sensor fabrication processes, thereby increasing the signal-to-noise ratio of the sensor 16.

Figure 7:
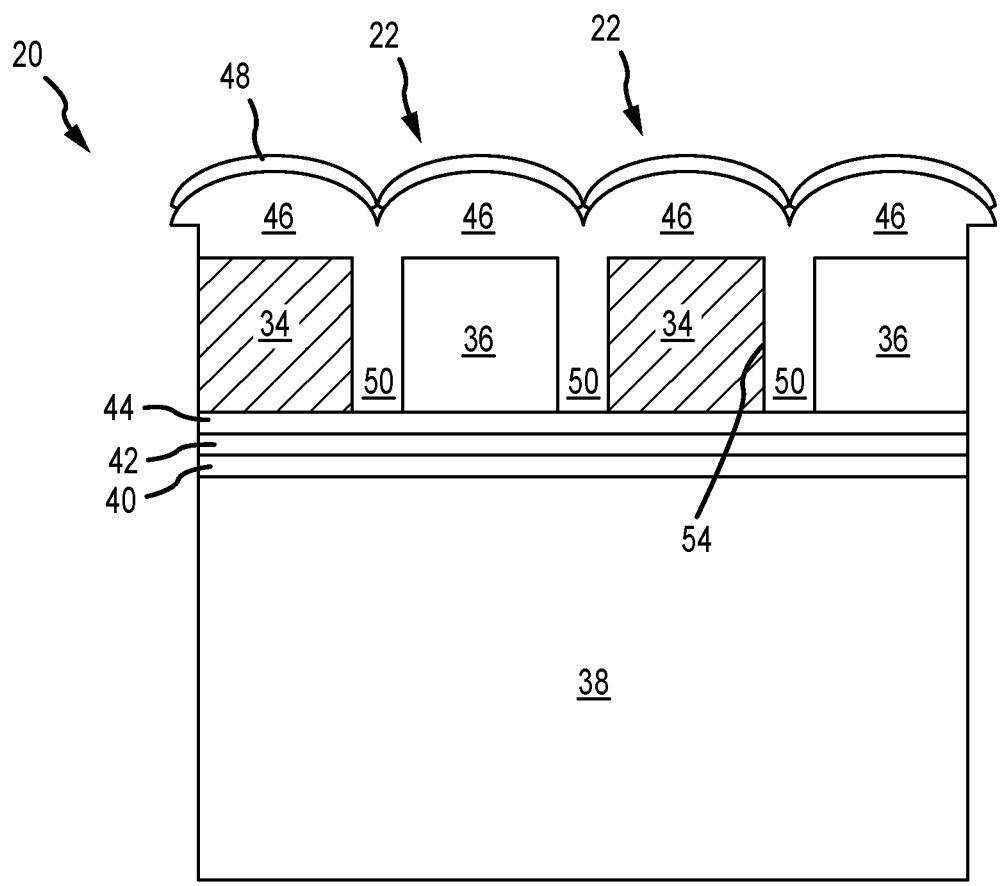
FIG. 7 is a cross-sectional side view of a portion of an illustrative pixel array of the type shown in FIG. 3 in which microlenses form the color filter container structures.

In another suitable arrangement, material from microlenses 46 may be used to form container structures 50. An illustrative example of such an arrangement is shown in FIG. 7. In this arrangement, the gaps between elements 34 and 36 are filled with the same material that is used to form microlenses 46. Although microlenses 46 are formed of transparent material (e.g., transparent organic material) to direct light to the photodiodes in silicon layer 38, there may be a relatively large index of refraction difference between the material of microlenses 46 and the elements in the color filter layer. Accordingly, there may be a relatively large index of refraction difference between color filter container structures 50 formed from material from microlenses 46 and colored elements 34. Because clear elements 36 are formed of transparent materials having high indices of refraction, there may also be a high index of refraction difference between color filter container structures 50 formed from microlens material 46 and clear elements 36, despite the fact that both of these structures are transparent. These large index of refraction differences may prevent light from passing from the clear element 36 or colored element 34 of one pixel into the filter element of an adjacent pixel, thereby reducing cross-talk between pixels 22. By using the material of microlenses 46 as the color filter container material 50, the need for an additional layer of material for the color filter container structures (and the manufacturing steps associated with such a layer) may be avoided.

Figure 8:
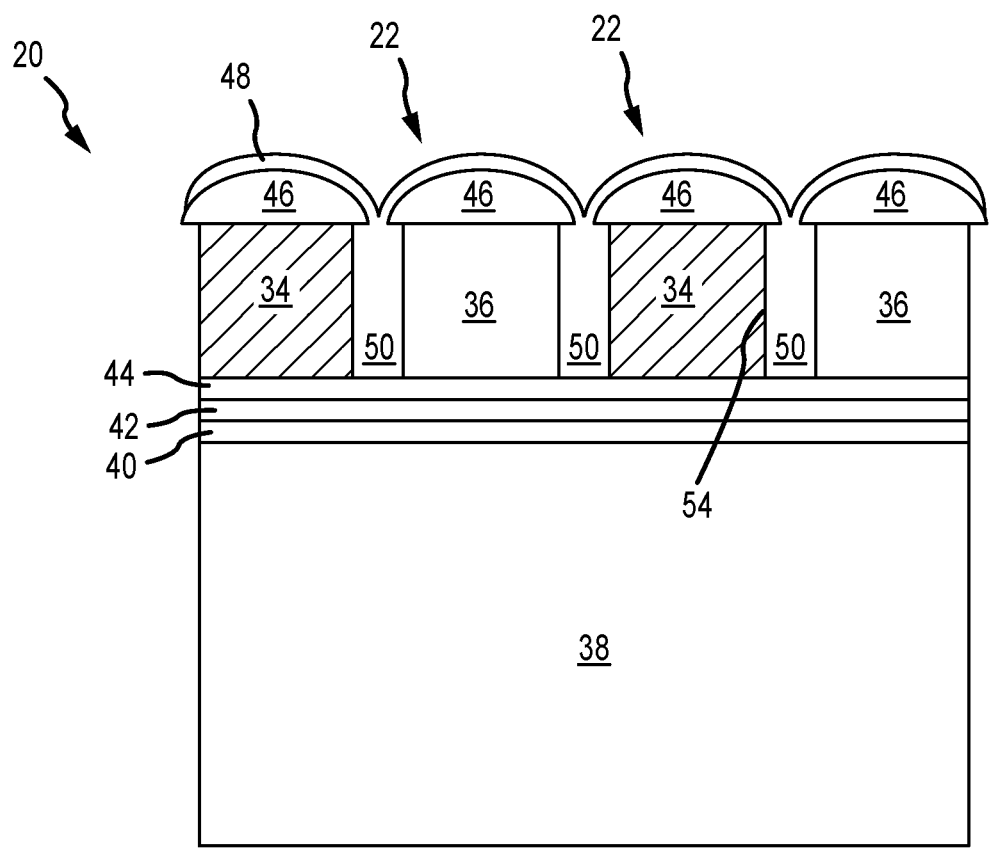
FIG. 8 is a cross-sectional side view of a portion of an illustrative pixel array of the type shown in FIG. 3 in which an antireflection layer forms the color filter container structures.

In another suitable arrangement, antireflective coating 48 may be used to form container structures 50. An illustrative example of such an arrangement is shown in FIG. 8. In this arrangement, the gaps between elements 34 and 36 are filled with antireflective material 48. Although antireflective coating 48 is formed of transparent material (e.g., transparent dielectric material such as silicon dioxide) to allow light to reach photodiodes in silicon layer 38, there may be a relatively large index of refraction difference between antireflective coating 48 and the elements in the color filter layer. Accordingly, there may be a relatively large index of refraction difference between color filter container structures 50 formed from material from antireflective layer 48 and colored elements 34. Because clear elements 36 are formed of transparent materials having high indices of refraction, there may also be a high index of refraction difference between color filter container structures 50 formed from antireflective layer 48 and clear elements 36, despite the fact that both of these structures are transparent. These large index of refraction differences may prevent light from passing from the clear element 36 or colored element 34 of one pixel into the filter element of an adjacent pixel, thereby reducing cross-talk between pixels 22. By using the material of antireflection layer 48 as the color filter container material 50, the need for an additional layer of material for the color filter container structures (and the manufacturing steps associated with such a layer) may be avoided.

Figure 9:
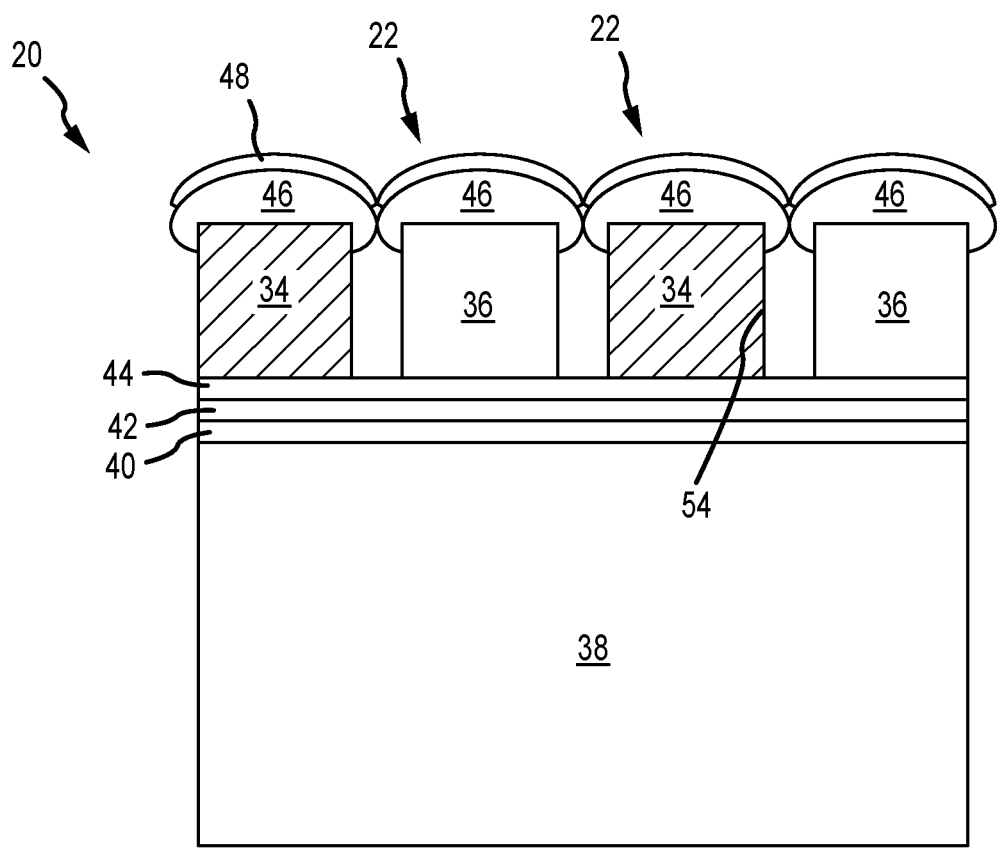
FIG. 9 is a cross-sectional side view of a portion of an illustrative pixel array of the type shown in FIG. 3 in which air gaps that are sealed off by an antireflection layer separate the elements in the color filter layer.
Figure 10:
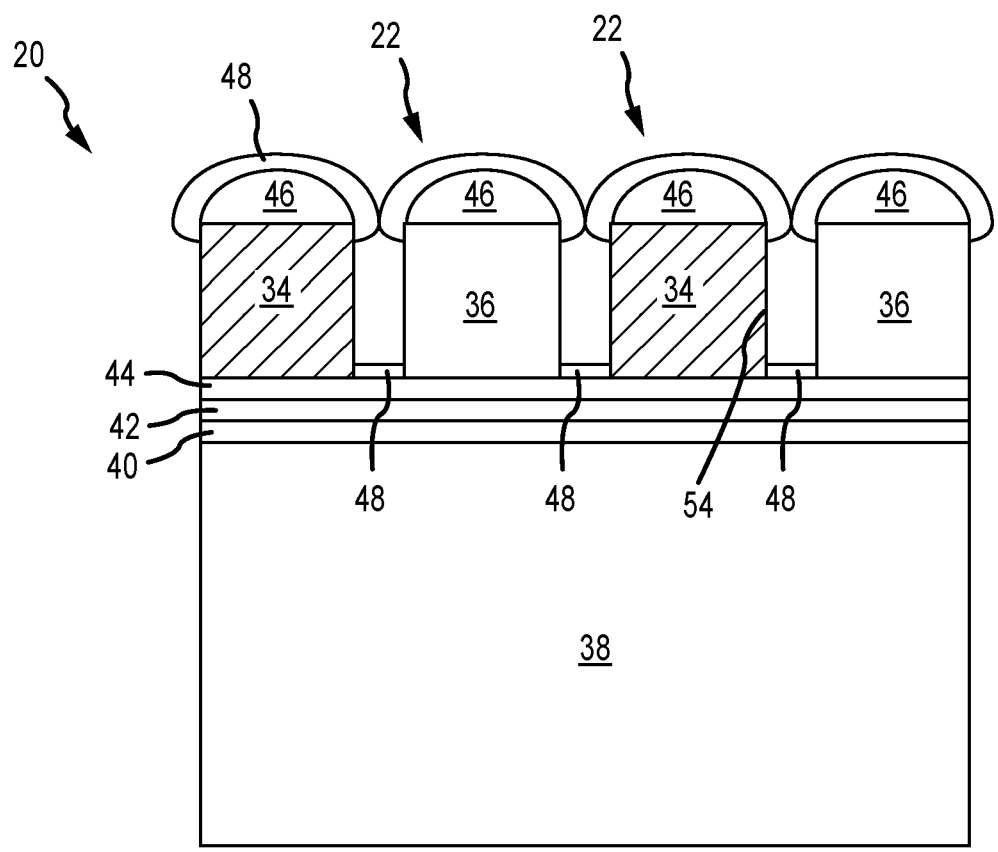
FIG. 10 is a cross-sectional side view of a portion of an illustrative pixel array of the type shown in FIG. 3 in which air gaps that are sealed off by microlenses separate the elements in the color filter layer.

In another suitable arrangement, the gaps between color filter elements 34 and clear elements 36 may be filled with air rather than opaque or transparent material of the type described above in connection with FIGS. 1-8. Illustrative examples of this type of arrangement are shown in FIGS. 9 and 10. In the arrangement of FIG. 9, microlenses 46 are formed such that they close off the tops of the air gaps between color filter elements 34 and clear elements 36. In the arrangement of FIG. 10, antireflective coating 48 is deposited such that the dielectric material of the antireflective coating 48 closes off the tops of the gaps between color filter elements 34 and clear elements 36. Due to the deposition process used to form antireflective coating 48, some of the dielectric material may be deposited onto dielectric layer 44 between elements 34 and 36, as shown in FIG. 10.

In the examples of FIGS. 9 and 10, color filter element container structures 50 are omitted from pixel array 20. Although the air that replaces the container structures 50 is generally transparent, there may still be a relatively large index of refraction difference between the air and the elements in the color filter layer. Accordingly, there may be a relatively large index of refraction difference between the air and colored elements 34, as well as between the air and clear elements 36. These high index of refraction differences may prevent light from passing from the clear element 36 or colored element 34 of one pixel into the filter element of an adjacent pixel, thereby reducing cross-talk between pixels 22. By not forming color filter container structures 50 (and instead utilizing the high refractive index difference between the elements 34/36 and air to prevent crosstalk), the need for an additional layer of material for the color filter container structures (and the manufacturing steps associated with such a layer) may be avoided.

Figure 11:
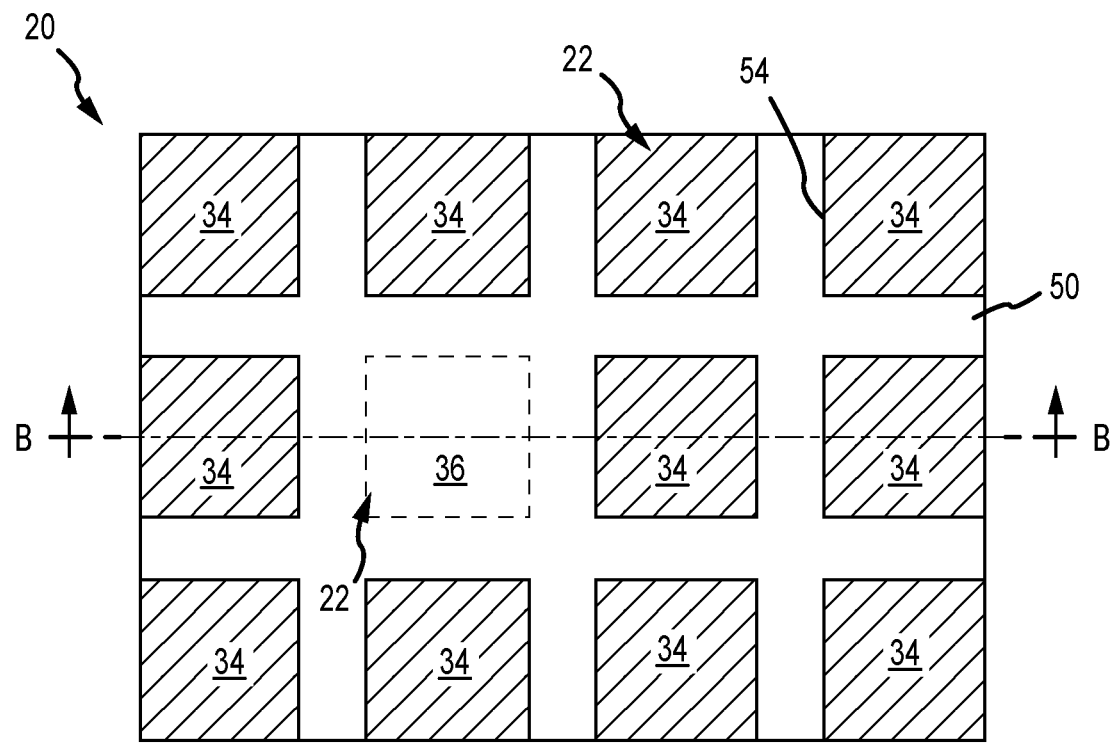
FIG. 11 is a top view of a portion of an illustrative pixel array having a color filter layer with colored elements, clear elements, and color filter container structures formed from the same material as the clear elements.

If desired, clear elements 36 and color filter container structures 50 may be formed of the same material (e.g., as a single continuous structure). A top view of an illustrative pixel array 20 having this type of arrangement is shown in FIG. 11. As shown in FIG. 11, colored elements 34 are separated from each other by color filter container structures 50 (i.e., colored filter elements 34 are formed in the openings 54 of container structures 50). Instead of forming openings 54 for clear elements 36, however, the material of color filter container structures 50 may fill the locations in array 20 at which clear elements 36 are to be formed (illustrated by the dashed line showing the location of clear element 36 among other portions of the same material that forms container structures 50). In other words, the material of clear elements 36 may extend between colored elements 34 to form container structures 50 having openings 54 in which colored elements 34 are formed.

Figure 12:
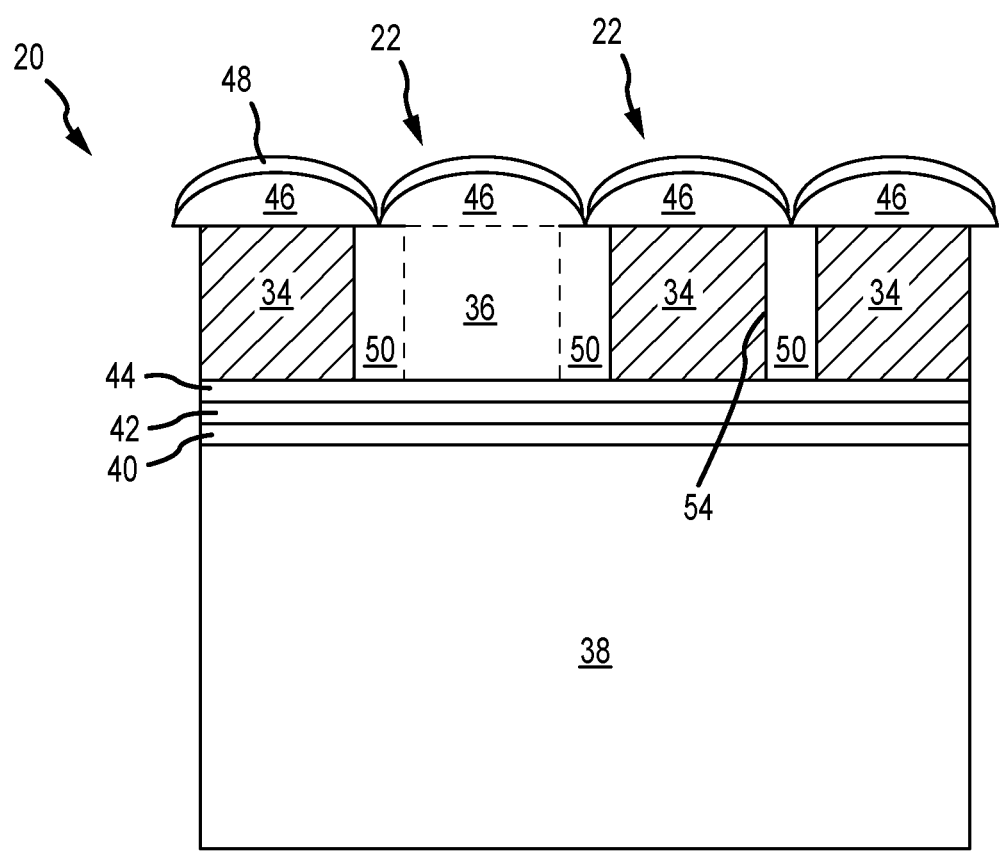
FIG. 12 is a cross-sectional side view of a portion of an illustrative pixel array of the type shown in FIG. 11.

FIG. 12 is a cross-sectional side view of a pixel array 20 taken along line B-B in FIG. 11. As shown by the dashed lines in FIG. 12, the clear material of clear element 36 may take up the entire gap between colored elements 34. In these locations in the color filter layer, the index of refraction difference between clear element 36 and the colored element 34 (which abut each other in this case) may be sufficiently large so as to prevent light that is incident at the junction between the two materials from passing from element 36 to element 34 (or vice-versa). The clear material of clear element 36 may also extend between adjacent colored elements 34 between which there is no clear element 36, instead forming a portion of the grid of color filter container structures 50. Where the clear material of elements 36 forms the container structures 50, the index of refraction difference between the container structures 50 and the colored elements 34 may be sufficiently large so as to prevent light from prematurely exiting one colored element 34 and entering another adjacent pixel 22.

Figure 13:
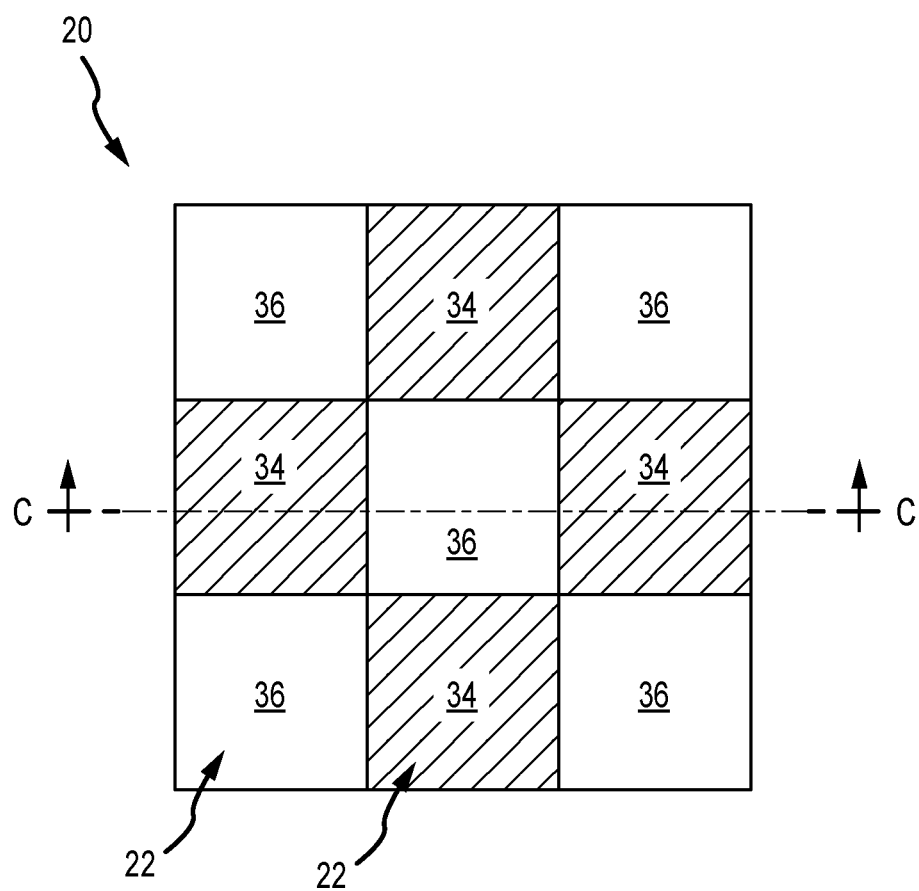
FIG. 13 is a top view of a portion of an illustrative pixel array having a color filter layer with colored elements and clear elements.

If desired, array 20 may be formed without container structures 50 or air gaps between elements 34 and 36 such that some or all of the elements in the array abut each other. A top view of an illustrative example of this type of arrangement is shown in FIG. 13. As shown in FIG. 13, the edges of each filter element abut the edges of the filter elements adjacent to it. There are no gaps between the filter elements 34 and 36 in the example of FIG. 13, so neither container structures 50 of the type shown in FIGS. 3-8, 11, and 12, nor air gaps of the type shown in FIGS. 9 and 10, are present.

Figure 14:
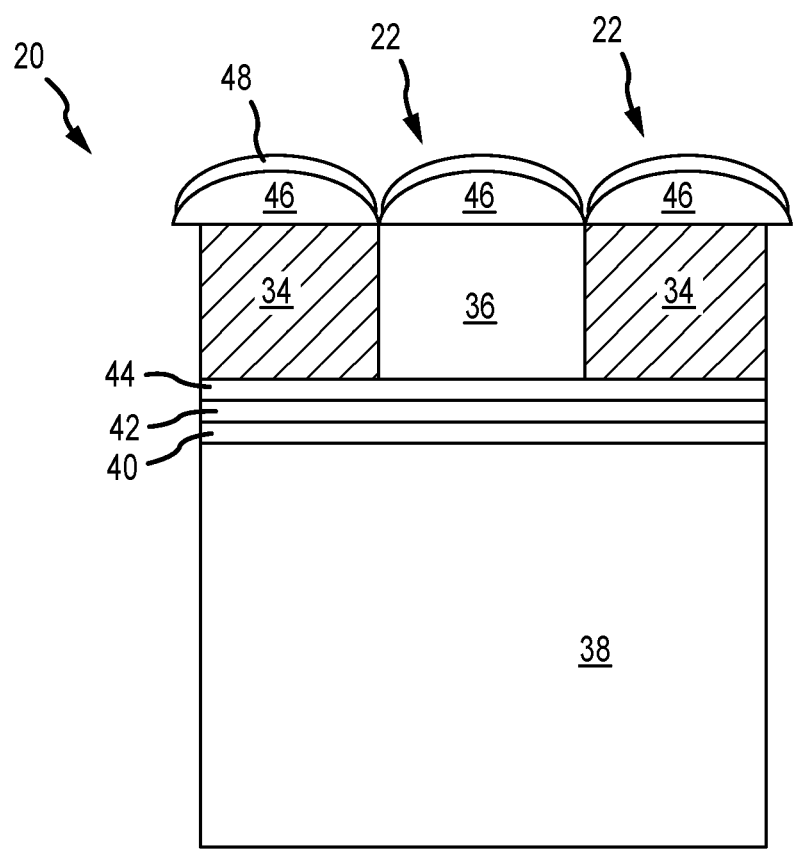
FIG. 14 is a cross-sectional side view of a portion of an illustrative pixel array of the type shown in FIG. 13.

FIG. 14 is a cross-sectional side view of a pixel array 20 taken along line C-C in FIG. 13. As shown in FIG. 14, the vertical sidewalls of clear element 36 directly contact the vertical sidewalls of adjacent elements 34. In this type of arrangement, the index of refraction difference between clear element 36 and the colored element 34 may be sufficiently large so as to prevent light that is incident at the junction between the two materials from passing from element 36 to element 34 (or vice-versa). Due to the large index of refraction difference between the material that forms clear element 36 and the material that forms colored elements 34, a grid of light-blocking material (e.g., container structures 50) may be omitted while still minimizing crosstalk between adjacent pixels.

In one suitable example, the arrangements described above may be incorporated in backside illuminate image sensors in which metal routing structures for the pixels 22 are beneath the photodiodes in epitaxial silicon layer 38. In this type of arrangement, light does not pass through the metal routing structures before reaching the photodiodes. In another suitable example, the arrangements described above may be incorporated in a frontside illuminate image sensor in which metal routing structures for the pixels 22 are between the photodiodes in epitaxial silicon layer 38 and the microlenses 46. In this type of arrangement, light does pass through the metal routing structures before reaching the photodiodes.

In the examples of FIGS. 3-14 described above, the pixel array 20 is described as including both colored elements 34 and clear elements 36. This, however, is merely illustrative. If desired, pixel array 20 may be provided exclusively with clear elements 36 (i.e., may be free of colored elements 34) in order to provide a monochromatic image sensor 16. In arrangements in which image sensor 16 is monochromatic, container structures 50 may be provided as described above in connection with any of the examples in FIGS. 3-8, 11, and 12, or may be omitted as described above in connection with any of the examples of FIGS. 9, 10, 13, and 14.

In the examples of FIGS. 3-14, each element in the color filter layer (i.e., colored elements 34 and clear elements 36) are described as corresponding to a single pixel 22 (i.e., overlapping a single photodiode in epitaxial silicon layer 38). In this type of arrangement, a single colored element 34 or clear element 36 for a single photodiode is formed in each opening 54. This, however, is merely illustrative. If desired, a single colored element 34 may be provided for (overlap) multiple pixels 22 (e.g. multiple adjacent pixels of the same color). Likewise, a single clear element 36 may be provided for (overlap) multiple pixels 22 (e.g., multiple adjacent clear pixels). In arrangements such as these, a single opening 54 in container structures 50 may be large enough to overlap multiple photodiodes of multiple adjacent pixels. The clear dielectric material or colored photoresist for the multiple pixels may fill these larger openings in container structures 50. If desired, single clear or colored elements that overlap photodiodes for multiple pixels may also be implemented in arrangements that do not include container structures 50 (e.g., arrangements of the type shown and described in connection with FIGS. 13 and 14).

Figure 15:
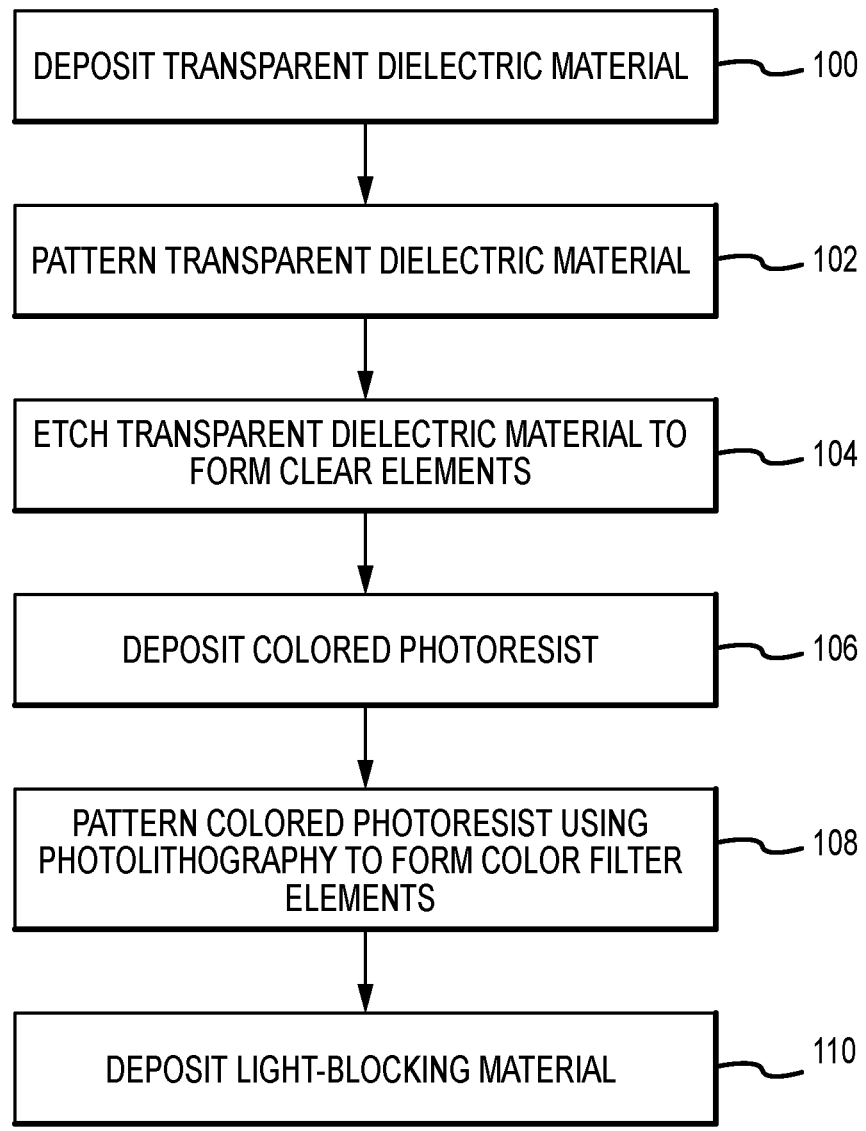
FIG. 15 is a flow chart of illustrative method steps that may be involved in forming a pixel array having a color filter layer with colored elements, clear elements, and color filter container structures.

A flow chart of illustrative method steps that may be involved in forming a pixel array of the type shown in FIGS. 3-14 is shown in FIG. 15.

At step 100, transparent dielectric material may be deposited (e.g., over dielectric layers 40, 42, and/or 44).

At step 102, the transparent dielectric material may be patterned (e.g., using photolithography techniques).

At step 104, the patterned transparent dielectric material may be etched to form clear elements 36.

At step 106, colored photoresist may be deposited in locations in which color filter elements 34 are to be formed.

At step 108, the colored photoresist may be patterned using photolithography techniques to form the color filter elements 34.

At step 110, light blocking material may be deposited to form color filter container structures 50. The light-blocking material may be opaque organic material, transparent organic material used to form planarization layer 52 or microlenses 46, or transparent dielectric material used to form antireflection coating 48. In arrangements in which container structures 50 are formed of the same material as clear elements 36, step 110 may be performed simultaneously with steps 100, 102, and 104 (i.e., before steps 106 and 108). In arrangements in which container structures 50 are omitted (e.g., there are air gaps or no gaps between the elements in the color filter array), step 110 may be omitted (e.g., step 110 may be optional). In examples in which image sensor 16 is a monochromatic image sensor, steps 106 and 108 may be omitted (e.g., steps 106 and 108 may be optional).

Figure 16:
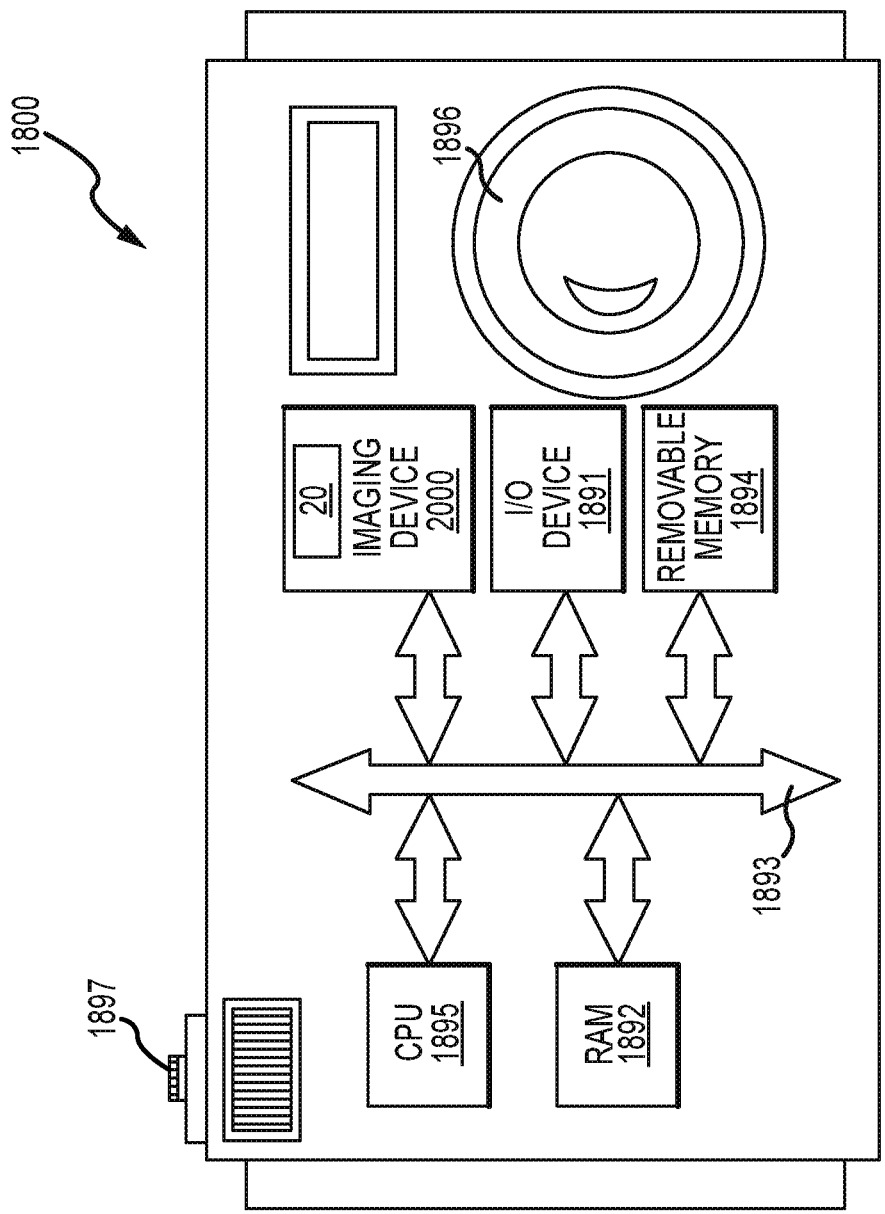
FIG. 16 is a block diagram of an illustrative processor system employing the embodiments of FIGS. 1-15 in accordance with an embodiment of the present invention.

FIG. 16 shows in simplified form a typical processor system 1800, such as a digital camera, which includes an imaging device 2000 (e.g., an imaging device 2000 such as image sensor 16 employing image pixel array 20 of the type shown in FIGS. 1-14 having clear elements 36 formed of dielectric material). The processor system 1800 is exemplary of a system having digital circuits that could include imaging device 2000. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The processor system 1800 generally includes a lens 1896 for focusing an image on pixel array 20 of device 2000 when a shutter release button 1897 is pressed, central processing unit (CPU) 1895, such as a microprocessor which controls camera and one or more image flow functions, which communicates with one or more input/output (I/O) devices 1891 over a bus 1893. Imaging device 2000 also communicates with the CPU 1895 over bus 1893. The system 1800 also includes random access memory (RAM) 1892 and can include removable memory 1894, such as flash memory, which also communicates with CPU 1895 over the bus 1893. Imaging device 2000 may be combined with the CPU, with or without memory storage on a single integrated circuit or on a different chip. Although bus 1893 is illustrated as a single bus, it may be one or more busses or bridges or other communication paths used to interconnect the system components.

In accordance with various embodiments, a pixel array may include an array of photodiodes and a color filter layer that overlaps the array of photodiodes. The color filter layer may include a grid of color filter container material that forms an array of openings over the array of photodiodes, organic color filter material that fills a first set of the openings, and transparent dielectric material that fills a second set of the openings. The transparent dielectric material may form the grid of color filter container material such that the second set of openings is defined by blocks of transparent dielectric material that are integrally formed with the grid of color filter container material, rather than by gaps in the grid of color filter container material. The transparent dielectric material may include silicon nitride. The grid of color filter container material may be opaque. The grid of color filter container material may include transparent organic material. The organic color filter material may have a first index of refraction, and the transparent dielectric material may have a second index of refraction that is greater than the first index of refraction. The grid of color filter container material may include an additional transparent dielectric material that has a third index of refraction that is different than the second index of refraction.

In accordance with various embodiments, a pixel array may include an array of photodiodes and a color filter layer. The color filter layer may include first color filter elements having a first refractive index formed over a first group of photodiodes in the array, second color filter elements having a second refractive index formed over a second group of photodiodes in the array, and clear dielectric material having a third refractive index formed over a third group of photodiodes in the array. The third refractive index may be greater than the first refractive index and the second refractive index. The clear dielectric material may extend between the first color filter elements and the second color filter elements to form a grid of openings in which the first color filter elements and the second color filter elements are formed. Each of the first color filter elements and the second color filter elements may be surrounded by the clear dielectric material. A grid of material that is separate from the first color filter elements, the second color filter elements, and the clear dielectric material may form an array of openings in which the first color filter elements, the second color filter elements, and the clear dielectric material are formed. The grid of material may be opaque. The pixel array may include an array of microlenses formed from transparent organic material that overlaps the color filter layer and an antireflective coating formed on the array of microlenses. The transparent organic material that forms the microlenses may also form the grid of material. The antireflective coating may form the grid of material. The array of microlenses may be formed directly on the first color filter elements, the second color filter elements, and the clear dielectric material. The pixel array may include a planarization layer interposed between the color filter layer and the array of microlenses. The planarization layer may form the grid of material. The planarization layer and the grid of material may be formed from indium tin oxide.

In accordance with various embodiments, a method of forming a color filter layer for an image sensor may include depositing, patterning (e.g., using photolithography), and etching transparent dielectric material to form clear elements in the color filter layer, depositing colored photoresist between the clear elements, patterning the colored photoresist to form color filter elements, and depositing a grid of light-blocking material to form color filter container structures in which the color filter elements are formed. The grid of light-blocking material may be formed from the transparent dielectric material that forms the clear elements.

The foregoing is merely illustrative of the principles of this invention and various modifications can be made by those skilled in the art without departing from the scope and spirit of the invention. The foregoing embodiments may be implemented individually or in any combination.

What is claimed is:

1. A pixel array comprising:
   an array of photodiodes;
   a first dielectric layer;
   a second dielectric layer; and
   a color filter layer that overlaps the array of photodiodes, the color filter layer comprising:
      a grid of color filter container material that forms an array of openings over the photodiodes in the array of photodiodes, wherein the grid of color filter container material has a refractive index, wherein the grid of color filter container material extends from the first dielectric layer to the second dielectric layer, and wherein the first dielectric layer is formed from the color filter container material;
      organic color filter material in a first set of the openings, wherein the organic color filter layer extends from the first dielectric layer to the second dielectric layer; and
      transparent dielectric material in a second set of the openings, the transparent dielectric material forming clear color filter elements, wherein the clear color filter elements extend from the first dielectric layer to the second dielectric layer and wherein the transparent dielectric material has a refractive index that is greater than the refractive index of the color filter container material.

2. The pixel array defined in claim 1, wherein the transparent dielectric material comprises silicon nitride.

3. The pixel array defined in claim 1, wherein the organic color filter material has a refractive index that is less than the refractive index of the transparent dielectric material.

4. A pixel array comprising:
an array of photodiodes;
a first dielectric layer;
a second dielectric layer; and
a color filter layer comprising:
  first color filter elements having a first refractive index formed over a first group of photodiodes in the array;
  second color filter elements having a second-refractive index formed over a second group of photodiodes in the array, wherein the first color filter elements and the second color filter elements extend from the first dielectric layer to the second dielectric layer;
  clear dielectric material having a third refractive index that forms clear color filter elements formed over a third group of photodiodes in the array, wherein the third refractive index is greater than the first refractive index and the second refractive index and wherein the clear color filter elements extend from the first dielectric layer to the second dielectric layer; and
  transparent color filter container material that forms a grid of openings in which the first color filter elements, second color filter elements, and clear color filter elements are formed, wherein the transparent color filter container material has a fourth refractive index that is less than the third refractive index.

5. The pixel array defined in claim 4, further comprising:
an array of microlenses formed from transparent organic material that overlaps the color filter layer; and
an antireflective coating formed on the array of microlenses.

6. The pixel array defined in claim 4, wherein the first dielectric layer comprises a planarization layer interposed between the color filter layer and the array of microlenses, wherein the planarization layer is formed from the transparent color filter container material.

7. The pixel array defined in claim 6, wherein the planarization layer and the transparent color filter container material are formed from indium tin oxide.

8. The pixel array defined in claim 1, further comprising an array of microlenses that overlaps the first dielectric layer.

9. The pixel array defined in claim 4, wherein the second dielectric layer is formed from the clear dielectric material.

10. The pixel array defined in claim 4, wherein the transparent color filter container material is formed entirely from a material that forms the first dielectric layer.

11. A pixel array comprising:
an array of photodiodes;
a first dielectric layer;
a second dielectric layer; and
a color filter layer comprising:
  color filter elements having a first refractive index formed over a first group of photodiodes in the array wherein the color filter elements are in contact with the first dielectric layer and the second dielectric layer;
  clear dielectric material having a second refractive index that forms clear color filter elements formed over a second group of photodiodes in the array, wherein the second refractive index is greater than the first refractive index and wherein the clear color filter elements are in contact with the first dielectric layer and the second dielectric layer; and
  transparent color filter container material that forms a grid of openings in which the first color filter elements and clear color filter elements are formed, wherein the transparent color filter container material has a third refractive index that is less than the second refractive index.

12. The pixel array defined in claim 11, wherein the transparent color filter container material is formed from the same material as the second dielectric layer.

13. The pixel array defined in claim 1, wherein the clear color filter elements are in contact with the first dielectric layer and the second dielectric layer.

* * * * *